(12) United States Patent
Muramoto et al.

(10) Patent No.: US 11,090,886 B2
(45) Date of Patent: Aug. 17, 2021

(54) CYLINDRICAL BASE, MASTER AND MASTER MANUFACTURING METHOD

(71) Applicant: DEXERIALS CORPORATION, Tokyo (JP)

(72) Inventors: Yutaka Muramoto, Miyagi (JP); Masanao Kikuchi, Miyagi (JP); Shunichi Kajiya, Miyagi (JP); Takaaki Otowa, Miyagi (JP); Yasuhiro Takahashi, Miyagi (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 15/950,596

(22) Filed: Apr. 11, 2018

(65) Prior Publication Data

US 2018/0281239 A1     Oct. 4, 2018

Related U.S. Application Data

(62) Division of application No. 15/026,509, filed as application No. PCT/JP2014/082171 on Dec. 4, 2014, now Pat. No. 10,207,470.

(30) Foreign Application Priority Data

Dec. 20, 2013  (JP) ................................. 2013-264358

(51) Int. Cl.
*B29C 33/42* (2006.01)
*G11B 7/26* (2006.01)
(Continued)

(52) U.S. Cl.
CPC .......... *B29D 11/0074* (2013.01); *B29C 33/38* (2013.01); *B29C 33/3842* (2013.01);
(Continued)

(58) Field of Classification Search
CPC ..... B29D 11/0074; B29C 41/28; B29C 33/38; B29C 59/04; B29C 33/3842;
(Continued)

(56) References Cited

U.S. PATENT DOCUMENTS

2002/0122902 A1   9/2002  Ueda et al.
2004/0112088 A1   6/2004  Ueda et al.
(Continued)

FOREIGN PATENT DOCUMENTS

JP     2002-167227 A     6/2002
JP     2009-199086 A     9/2009
(Continued)

OTHER PUBLICATIONS

Jun. 14, 2018 Office Action issued in U.S. Appl. No. 15/026,509.
(Continued)

*Primary Examiner* — Mathieu D Vargot
(74) *Attorney, Agent, or Firm* — Oliff PLC (57) ABSTRACT

Provided are a cylindrical base, a master and a method for manufacturing a master enabling a uniform transfer of a fine pattern. A cylindrical base of a quartz glass having an internal strain in terms of birefringence of less than 70 nm/cm is used. A resist layer is deposited to an outer circumference surface of this cylindrical base, a latent image is formed on the resist layer, the latent image formed on the resist layer is developed and the pattern of the developed resist layer is used as a mask for etching to form a structure including concaves or convexes arranged in a plurality of rows on the outer circumference surface of the cylindrical base.

4 Claims, 11 Drawing Sheets

(51) Int. Cl.
- *B29D 11/00* (2006.01)
- *B29C 41/28* (2006.01)
- *B29C 33/38* (2006.01)
- *G03F 7/00* (2006.01)
- *G03F 7/24* (2006.01)
- *C03C 15/00* (2006.01)
- *B29C 59/04* (2006.01)
- *B29C 35/08* (2006.01)
- *B29L 11/00* (2006.01)

(52) U.S. Cl.
CPC ........ *B29C 33/424* (2013.01); *B29C 35/0805* (2013.01); *B29C 41/28* (2013.01); *B29C 59/04* (2013.01); *C03C 15/00* (2013.01); *G03F 7/0002* (2013.01); *G03F 7/24* (2013.01); *G11B 7/261* (2013.01); *B29C 35/0888* (2013.01); *B29C 59/046* (2013.01); *B29K 2909/08* (2013.01); *B29L 2011/00* (2013.01); *C03C 2218/34* (2013.01)

(58) Field of Classification Search
CPC ... B29C 33/424; B29C 35/0805; G11B 7/261; G03F 7/0002; G03F 7/24
See application file for complete search history.

(56) References Cited

U.S. PATENT DOCUMENTS

| | | |
|---|---|---|
| 2011/0084424 A1 | 4/2011 | Kaida et al. |
| 2011/0318996 A1 | 12/2011 | Okafuji et al. |
| 2013/0160496 A1 | 6/2013 | Brehm et al. |
| 2014/0314898 A1 | 10/2014 | Mitamura et al. |

FOREIGN PATENT DOCUMENTS

| | | |
|---|---|---|
| JP | 2010-156843 A | 7/2010 |
| JP | 2011-020360 A | 2/2011 |
| JP | 2013-133277 A | 7/2013 |
| WO | 2013/077266 A1 | 5/2013 |

OTHER PUBLICATIONS

Mar. 10, 2015 Search Report issued in International Patent Application No. PCT/JP2014/082171.
Jun. 30, 2016 Office Action issued in Chinese Patent Application No. 201480043133.5.
Sep. 5, 2017 Office Action issued in U.S. Appl. No. 15/026,509.
Jan. 24, 2018 Office Action Issued in U.S. Appl. No. 15/026,509.
U.S. Appl. No. 15/026,509 filed Mar. 31, 2016 in the name of Muramoto et al.

CYLINDRICAL BASE, MASTER AND MASTER MANUFACTURING METHOD

This application is a Continuation of U.S. application Ser. No. 15/026,509 filed Mar. 31, 2016, now U.S. Pat. No. 10,207,470, which is a National Stage of International Application No. PCT/JP2014/082171 filed Dec. 4, 2014, which claims the benefit of Japanese Application No. 2013-264358 filed Dec. 20, 2013. The disclosures of the prior applications are hereby incorporated by reference herein in their entireties.

TECHNICAL FIELD

The present invention relates to a cylindrical base, a master and a method for producing a master for transferring a fine pattern onto such materials as light-curing resin.

BACKGROUND ART

Conventionally, a surface treatment is performed on optical elements using a transparent base material such as glass or plastic to reduce surface reflection of light. As such a surface treatment, a method exists for manufacturing a fine concave/convex pattern (for example, a moth eye pattern) on an optical element surface (for example, refer to PLT 1 and 2).

In these techniques, a master having a desired pattern formed on the surface thereof is used and transferring the pattern of the master to a sheet coated with, for example, a photosensitive resin or a thermosetting resin, enables inexpensive and mass production.

Furthermore, there is a method of forming a desired pattern on a cylindrical shaped quartz base using mastering techniques for optical discs. In this case, thermal lithography using thermal changes in an inorganic resist (for example, metal oxides made from one or more transition metals such as tungsten and molybdenum, among others) can be used. By using thermal lithography, thermal reaction is caused in only a central portion of the beam width which enables machining of a fine pattern exceeding the resolution limit of the laser light.

However, in exposure using mastering techniques for optical discs, variances in surface properties (waviness and unevenness) and shape (roundness) lead to adverse changes in exposure beam conditions. Furthermore, in the case of using thermal lithography, interaction between strain in the quartz base material and heating of the inorganic resist degrades pattern precision.

PRIOR ART LITERATURE

Patent Literatures

PLT 1: Japanese Unexamined Patent Application Publication No. 2009-199086
PLT 2: Japanese Unexamined Patent Application Publication No. 2010-156843

SUMMARY OF INVENTION

Technical Problem

In view of the foregoing, an object of the present invention is to provide a cylindrical base, a master and a method for manufacturing a master which enable uniform transfer of a fine pattern.

Solution to Problem

As the result of intensive studies, it has been found by the present inventors that using a cylindrical base having a small internal strain enables transfer of a fine pattern with a high precision and accuracy.

Accordingly, a cylindrical base according to the present invention is made of a cylindrically shaped quartz and internal strain of the cylindrical base in terms of birefringence is less than 70 nm/cm.

Additionally, a master according to the present invention includes the above-mentioned cylindrical base and a structure having convexes or concaves formed on the outer circumference surface of the cylindrical base.

Additionally, a method for manufacturing a master according to the present invention includes a resist depositing step of depositing a resist layer onto the outer circumference surface of the cylindrical base, an exposure step of forming a latent image on the resist layer, a developing step of developing the resist layer having the latent image formed thereon, and an etching step of etching the cylindrical base by using a pattern of the developed resist layer as a mask to form a structure having a plurality of concaves or convexes onto the outer circumference surface of the cylindrical base.

Additionally, a method for manufacturing an optical element for transferring the structure of the above-mentioned master to a light-curing resin layer according to the present invention includes steps of bringing the light-curing resin layer tightly in contact with an outer circumference surface of the master, curing the light-curing resin and peeling off the light-curing resin.

Advantageous Effects of Invention

According to the present invention, because internal strain within the cylindrical base is small, surface fluctuations caused by heat are small, enabling uniform transfer of a fine pattern.

DESCRIPTION OF EMBODIMENTS

Figure 1:
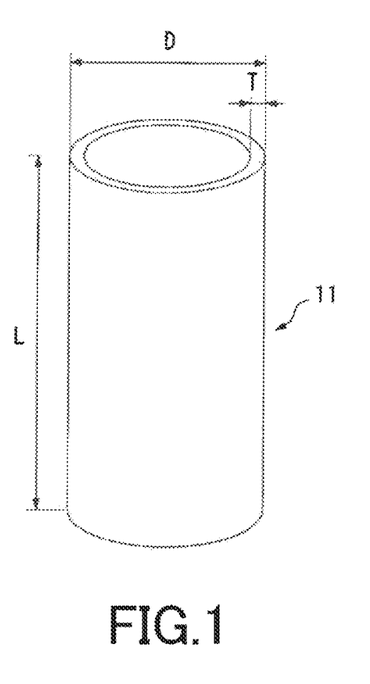
FIG. 1 is a schematic perspective view illustrating a cylindrical base.

An embodiment of the present invention will now be more particularly described with reference to the accompanying drawings according to the following order.
1. Cylindrical Base and Master
2. Method for Manufacturing a Master
3. Method for Manufacturing an Optical Element
4. Examples 1. Cylindrical Base and Master Cylindrical Base FIG. 1 is a schematic perspective view illustrating a cylindrical base. A cylindrical base 11 is made of a quartz glass in a cylindrical shape and is particularly suitable for use as a hollow cylindrical roll mold having a fine pattern formed on the outer circumference surface thereof. As long as $SiO_2$ purity is high, either fused quartz glass or synthetic quartz glass may be used as the quartz glass without particular limitation.

Furthermore, size of the cylindrical base 11, while being without particular limitation, may be selected according to use and, for example, may be a length L in the axial dimension of 100 mm or more, an outer diameter D of between 50 and 300 mm and a thickness T of between 2 and 50 mm.

Internal strain in terms of birefringence in the cylindrical base 11 is less than 70 nm/cm and more preferably 20 nm/cm or less. For example, in the case of using thermal lithography in exposing a desired pattern, smaller internal strain in the cylindrical base 11 will reduce surface fluctuations caused by heat and will suppress disarrangement of the pattern. Furthermore, in the case of exposing a moth eye pattern as an anti-reflection pattern, for example, it is possible to achieve a uniform in-plane distribution of the anti-reflection property. Moreover, generation of cloudy regions due to scattering of transmitted light caused by disarrangement of the pattern arrangement can be prevented.

Internal strain of this cylindrical base 11 is, for example, measured with a strain measuring instrument which measures birefringence caused by residual stress within a transparent body and is ordinarily expressed in terms of retardation per 1 cm of thickness (unit: nm/cm).

Waviness having a period of 10 mm or less in the circumferential direction on the outer circumference surface of the cylindrical base 11 preferably has an amplitude of less than 100 nm and more preferably 50 nm or less. In the case of using an exposure device having a configuration based on an optical disc recording device to draw the desired pattern on the cylindrical base 11 on which a resist has been deposited, because waviness on the outer circumference surface of the cylindrical base 11 in the circumferential direction having a period of 10 nm or less has an amplitude of less than 100 nm, tracking is possible with a focus servo mechanism of the exposure device which can suppress size fluctuations in an exposed pattern. For example, in the case of exposing a moth eye shaped anti-reflection pattern, a uniform in-plane distribution of the anti-reflection property can be achieved.

Waviness in the circumferential direction on the outer circumference surface of the cylindrical base 11 can be determined by measuring the curved surface of the cylinder to obtain coordinate data, for example, by using a stylus-type surface roughness measuring device.

Master

Figure 2A:
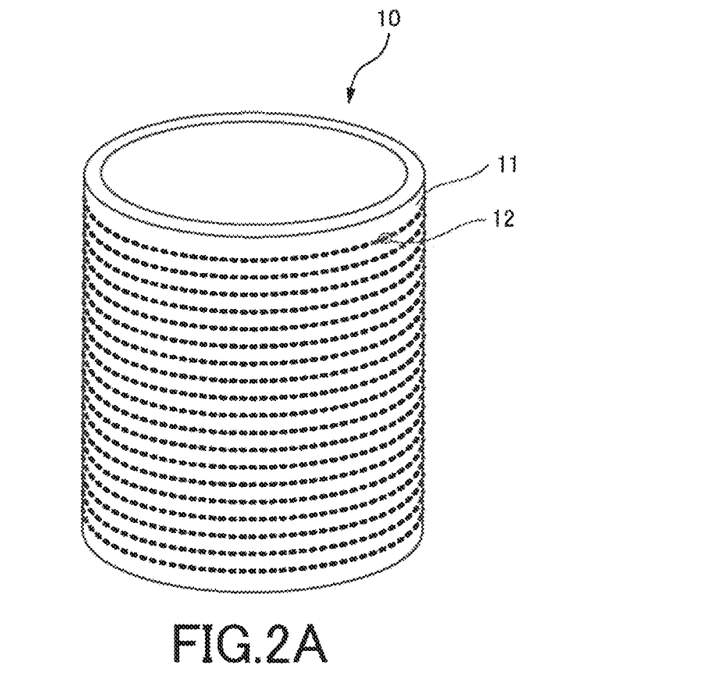
FIG. 2A is a perspective view illustrating one example of a configuration of a roll master and FIG. 2B is an enlarged plan view illustrating a portion of a surface of the roll master illustrated in FIG. 2A.
Figure 2B:
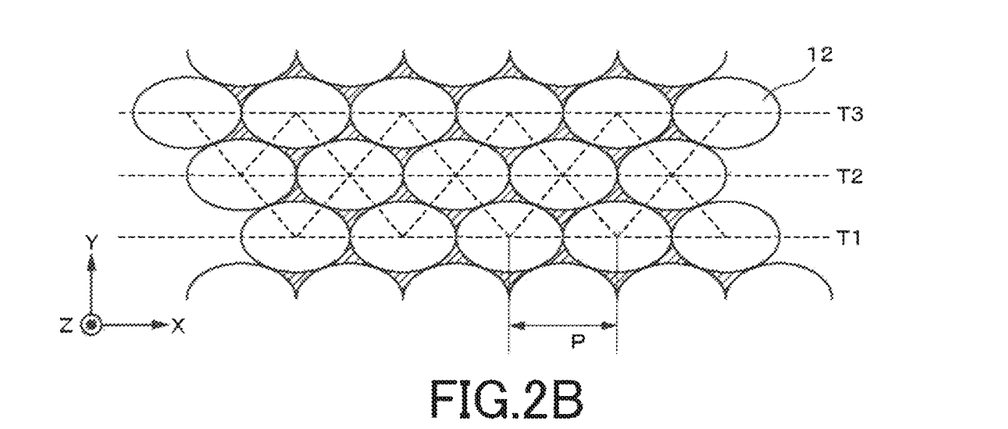

FIG. 2A is a perspective view illustrating one example of a configuration of a roll master and FIG. 2B is an enlarged plan view illustrating a portion of the surface of the roll master illustrated in FIG. 2A. This master 10, known as a roll master, includes the cylindrical base 11 and a structure 12 comprising a plurality of concaves or convexes arranged on the outer circumference surface of the cylinder substrate 11.

The structure 12 has a plurality of tracks T with a pitch P which is equal to or narrower than the wavelength of light in the intended use-environment for the target optical element, for example, approximately the wavelength of visible light, arranged to form a two-dimensional periodic array or, for example, arranged in concentric circles or in a spiral on the surface of the cylindrical base 11. Furthermore, the structure 12 may be arranged in a selected regular pattern such as, for example, a tetragonal lattice or a hexagonal lattice. Additionally, height of the structure 12 on the surface of the cylindrical base 11 may fluctuate regularly or irregularly.

2. Method for Manufacturing a Master

A method for manufacturing a master according to the present invention will now be explained. The method for manufacturing a master according to this embodiment includes a resist depositing step of depositing a resist layer onto the outer circumference surface of the above-described cylindrical base, an exposure step of forming a latent image on the resist layer, a developing step of developing the resist layer having the latent image formed thereon, and an etching step of etching the cylindrical base by using a pattern of the developed resist layer as a mask to form a structure having a plurality of concaves or convexes onto the outer circumference of the cylindrical base.

Because the cylindrical base used in this embodiment has an internal strain in terms of birefringence of less than 70 nm/cm, the exposure step in which a laser light is irradiated to the resist layer to form a latent image can be advantageously used. Additionally, using, for example, metal oxides of one or more transition metals such as tungsten and molybdenum, among others, as an inorganic resist, the exposure step of forming a latent image by using thermal lithography which uses thermal changes in the resist layer can be advantageously used. Thus, thermal reaction is caused in only the central portion of the beam width and a fine pattern exceeding the resolution limit of the laser light can be machined. Furthermore, to achieve a structure having a high aspect ratio, dry etching is preferably used.

Example device configurations for a usable exposure device for the exposure step and a usable etching device for the etching step are given below.

Exposure Device

Figure 3:
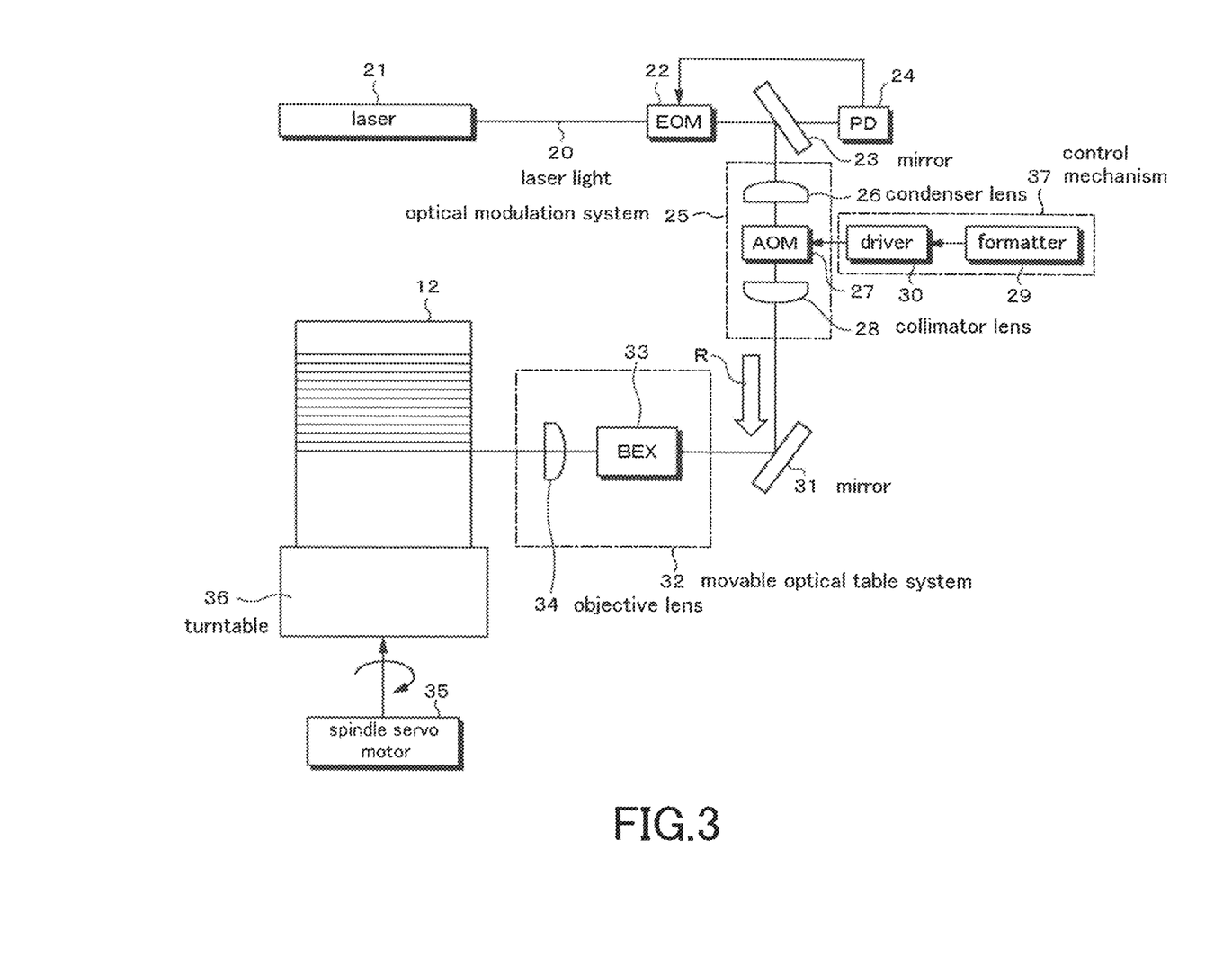
FIG. 3 is a schematic view illustrating one example of a configuration of an exposure device for manufacturing a roll master.

FIG. 3 is a schematic view illustrating one example of a configuration of an exposure device for manufacturing a roll master. This exposure device has a configuration based on an optical disc recording device.

A laser light source 21 is a light source for exposing the resist which is deposited as a recording medium on the surface of the cylindrical base 11 and emits a recording laser light 20 having, for example, a wavelength λ of 266 nm. The laser light 20 emitted by the laser light source 21 proceeds as a collimated beam and enters an electro-optic modulator (EOM) 22. The laser light 20 which has passed through the electro-optic modulator 22 is reflected by a mirror 23 and guided into an optical modulation system 25.

The mirror 23 comprises a polarizing beam splitter which reflects one polarization component and transmits the other polarization component. The polarization component transmitted through the mirror 23 is received by a photo diode 24 and, on the basis of this received light signal, phase modulation controlled by the electro-optic modulator 22 is performed on the laser light 20.

In the optical modulation system 25, the laser light 20 is collected by a condenser lens 26 into an acousto-optic modulator 27 (AOM) made from such a material as a glass ($SiO_2$). The laser light 20, after being intensity modulated and diverged in the acousto-optic modulator 27, is collimated by a collimator lens 28. The laser light 20 emitted from the optical modulation system 25 is reflected by a mirror 31 and led to a movable optical table 32 in a horizontal and parallel manner.

The movable optical table 32 includes a beam expander 33 and an objective lens 34. The laser light 20 led to the movable optical table 32 is adjusted by the beam expander 33 into a desired beam shape and then is irradiated via the objective lens 34 to the resist layer on the cylindrical base 11. The cylindrical base 11 is positioned on a turntable 36 which is connected to a spindle motor 35. While the cylindrical base 11 is rotated, the resist layer is intermittently irradiated with the laser light 20 while moving the laser light 20 in the height direction of the cylindrical base 11 to perform the exposure step of the resist layer. For example, the latent image formed is of approximately elliptical shapes in which the major axes are in the circumferential direction. Movement of the laser light 20 is accomplished by moving the movable optical table 32 in the direction indicated by the arrow R.

The exposure device includes, for example, a control mechanism 37 for forming a latent image of a two-dimensional pattern such as a hexagonal lattice or quasi-hexagonal lattice on the resist layer. The control mechanism 37 includes a formatter 29 and a driver 30. The formatter 29 includes a polarity inverter and this polarity inverter controls timing of irradiation of the laser light 20 to the resist layer. The driver 30 receives an output from the polarity inverter and controls the acousto-optic modulator 27.

In this exposure device, in order to create a spatially-linked two-dimensional pattern, a signal is generated once per track to synchronize the polarization inverting formatter signal and a rotation controller of the recording device, and intensity modulation is performed by the acousto-optic modulator 27. By patterning with an appropriate rotation speed at a constant angular velocity (CAV), an appropriate modulation frequency and an appropriate feed pitch, a two-dimensional pattern such as a hexagonal lattice or a quasi-hexagonal lattice can be recorded onto the resist layer.

Etching Device

Figure 4:
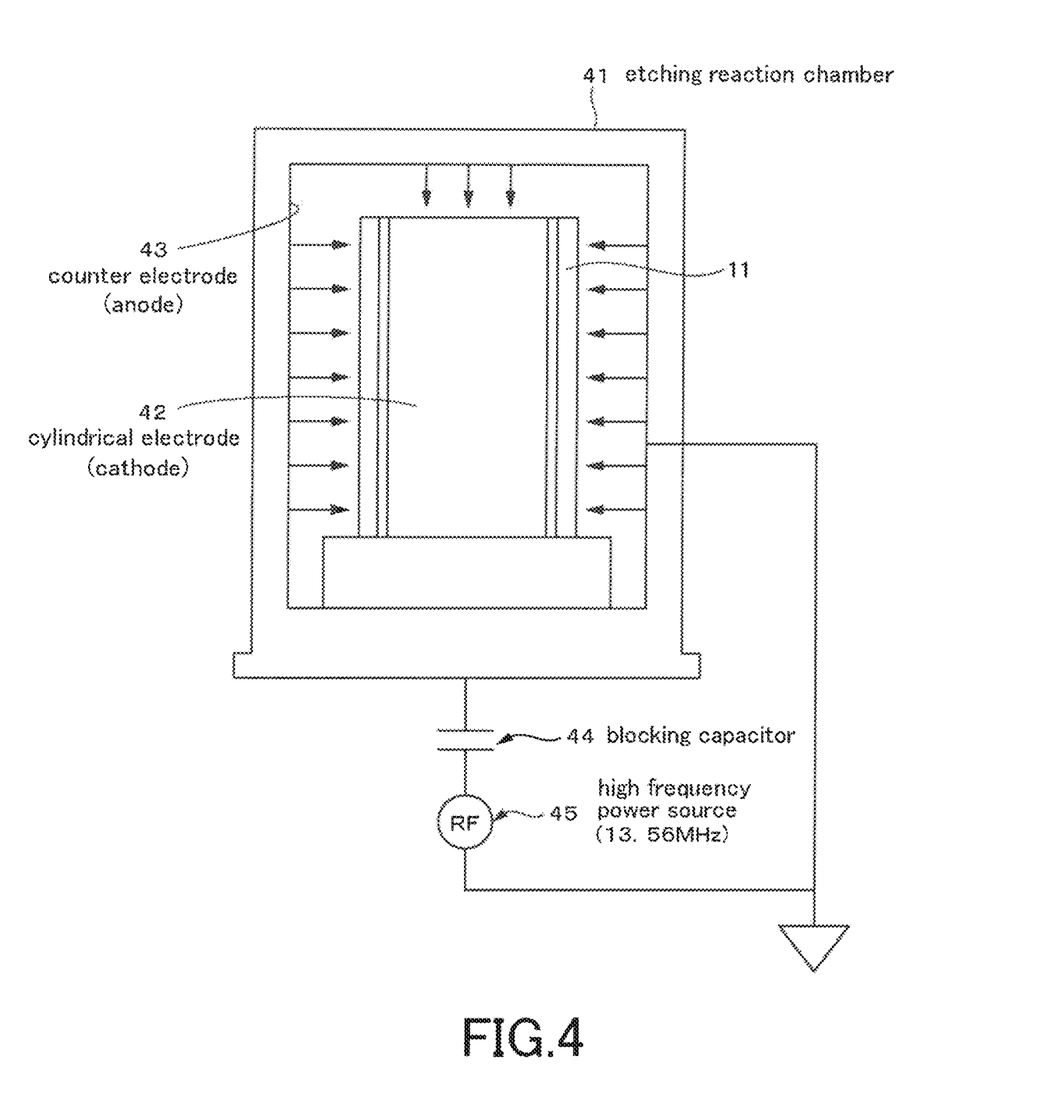
FIG. 4 is a schematic view illustrating one example of a configuration of an etching device for manufacturing a roll master.

FIG. 4 is a schematic view illustrating one example of a configuration of an etching device for manufacturing a roll master. The etching device, which is known as an RIE (Reactive Ion Etching) device, as illustrated in FIG. 4, includes an etching reaction chamber 41, a cylindrical electrode 42 which is a cathode and a counter electrode 43 which is an anode. The cylindrical electrode 42 is located in a central portion of the etching reaction chamber 41. The counter electrode 43 is provided on an inner side of the etching reaction chamber 41. The cylindrical electrode 42 is configured to enable removable attachment of the cylindrical base 11. For example, the cylindrical electrode 42 has a cylinder surface which corresponds to or is approximately the same as the cylinder surface of the cylindrical base 11 and, in particular, has a slightly smaller diameter than the inner diameter of the cylindrical base 11. The cylindrical electrode 42 is connected via a blocking capacitor 44 to a high frequency power source (RF) 45 having, for example, a frequency of 13.56 MHz. The counter electrode 43 is connected to a ground.

In this etching device, when a high frequency voltage is applied between the counter electrode 43 and the cylindrical electrode 42 by the high frequency power source 45, a plasma is generated between the counter electrode 43 and the cylindrical electrode 42. Because the counter electrode 43 is connected to a ground, electrical potential thereof does not change; contrastingly, a negative electric potential occurs in the cylindrical electrode 42 because the circuit is isolated by the blocking capacitor 44 and a voltage drop is generated. This voltage drop causes an electric field to be generated in the direction perpendicular to the cylinder surface of the cylindrical electrode 42 and plasma ions within the plasma perpendicularly collide with the outer circumference surface of the cylindrical base 11 and, thus, anisotropic etching is performed.

Steps of Method for Manufacturing a Master

Steps of a method for manufacturing a master according to this embodiment will now be explained in order with reference to FIGS. 5 and 6.

Resist Depositing Step

Figure 5A:
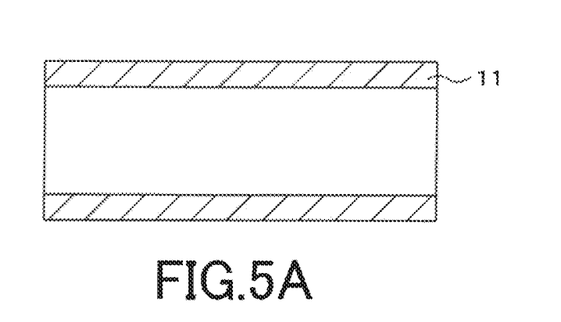
FIG. 5A is a schematic cross-sectional view illustrating a cylindrical base.
Figure 5B:
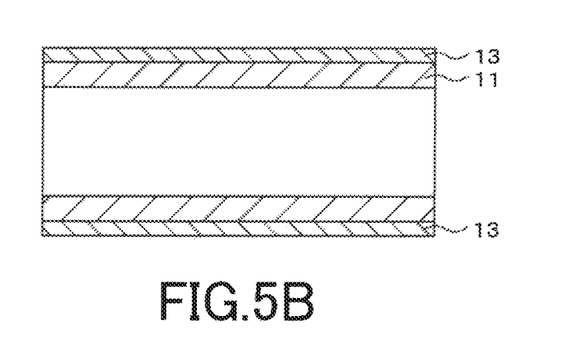
FIG. 5B is a schematic cross-sectional view illustrating a cylindrical base having a resist layer deposited on an outer circumference surface thereof and FIG. 5C is a schematic cross sectional view illustrating a cylindrical base in which the resist layer has been exposed.
Figure 5C:
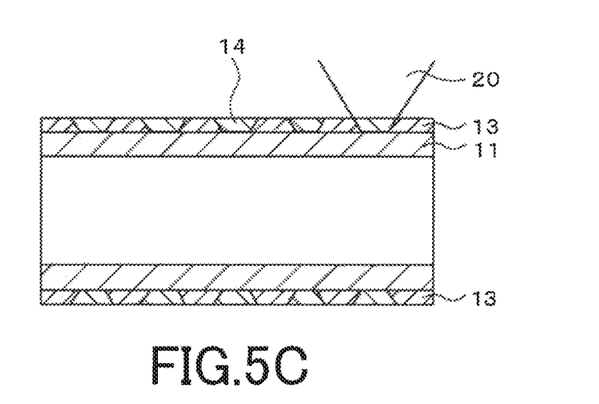
Figure 6A:
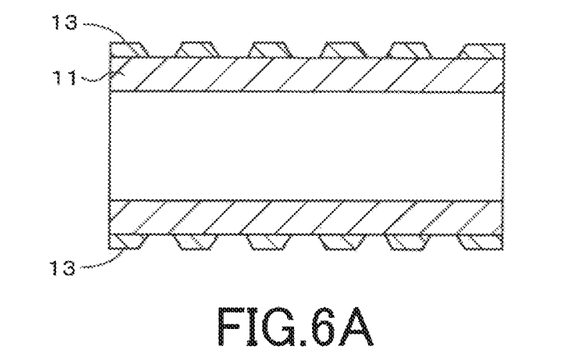
FIG. 6A is a schematic cross-sectional view illustrating a cylindrical base having a developed resist layer and FIG. 6B is a cross-sectional view illustrating a cylindrical base which has been etched.
Figure 6B:
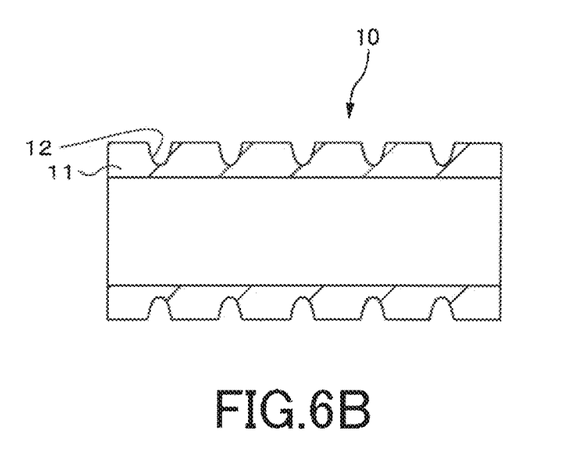

First, as illustrated in FIG. 5A, the previously mentioned cylindrical base 11 is prepared. This cylindrical base 11 is, for example, made of a quartz glass. Next, as illustrated in FIG. 5B, a resist layer 13 is deposited onto the outer circumference surface of the cylindrical base 11. As the material for the resist layer, for example, either an organic resist or an inorganic resist may be used. Examples of organic resists include, for example, novolac-type resists and chemically amplified resists. Examples of inorganic resists include, for example, metal oxides made from one or more transition metals such as tungsten and molybdenum.

Exposure Step

Next, using the exposure device illustrated in FIG. 3, while the cylindrical base 11 is rotated, a laser light (exposure beam) 20 is irradiated to the resist layer 13. At this time, while the laser light 20 is moved in the height direction (the direction parallel with the central axis) of the cylindrical base 11, by intermittently irradiating the laser light 20, the resist layer 13 is exposed across the entire surface thereof. As illustrated in FIG. 5C, a latent image 14 corresponding to the trace of the laser light 20 and having a pitch which is approximately the same as the wavelength of visible light is thereby formed on the entire surface of the resist layer 13. The latent image 14, for example, comprises tracks arranged in a plurality of rows and forms a hexagonal pattern or quasi-hexagonal pattern on the outer circumference surface of the cylindrical base 11. For example, the latent image 14 has, for example, an elliptical shape having a major axis in the direction to which the tracks extend.

Developing Step

Next, a developer is applied to the resist layer 13 to develop the resist layer 13. In the case of using a positive resist to form the resist layer 13, because exposed portions exposed to the laser light 20 have an increased dissolution rate in the developer in comparison to unexposed portions, as illustrated in FIG. 6A, a pattern corresponding to the latent image 14 (exposed portions) is formed in the resist layer 13.

Etching Step

Next, using the pattern (resist pattern) of the resist layer 13 formed on the cylindrical base 11 as a mask, the surface of the cylindrical base 11 is etched. As illustrated in FIG. 6B, concaves can thereby be formed which have an elliptical conic shape or an elliptical frustum shape having a major axis in the direction to which the tracks extend, thus achieving a structure 12. As the etching method, either dry etching or wet etching may be used; however, dry etching using, for example, the etching device illustrated in FIG. 4, is preferable. By using dry etching, a glass master having a depth of three times or more of that of the resist layer 13 (a selection ratio of three or more) can be manufactured and a high aspect ratio is achievable in the structure 12. By the above, a master 10 having, for example, a hexagonal or quasi-hexagonal pattern with concaves of a depth from approximately 200 nm to approximately 350 nm can be obtained.

3. Method for Manufacturing an Optical Element

In a method for manufacturing an optical element according to this embodiment, a light-curing resin layer is brought tightly in contact with the outer circumference surface of the master described above and the light-curing resin layer is peeled away after curing to transfer the structure of the master to the light-curing resin layer.

Figure 7:
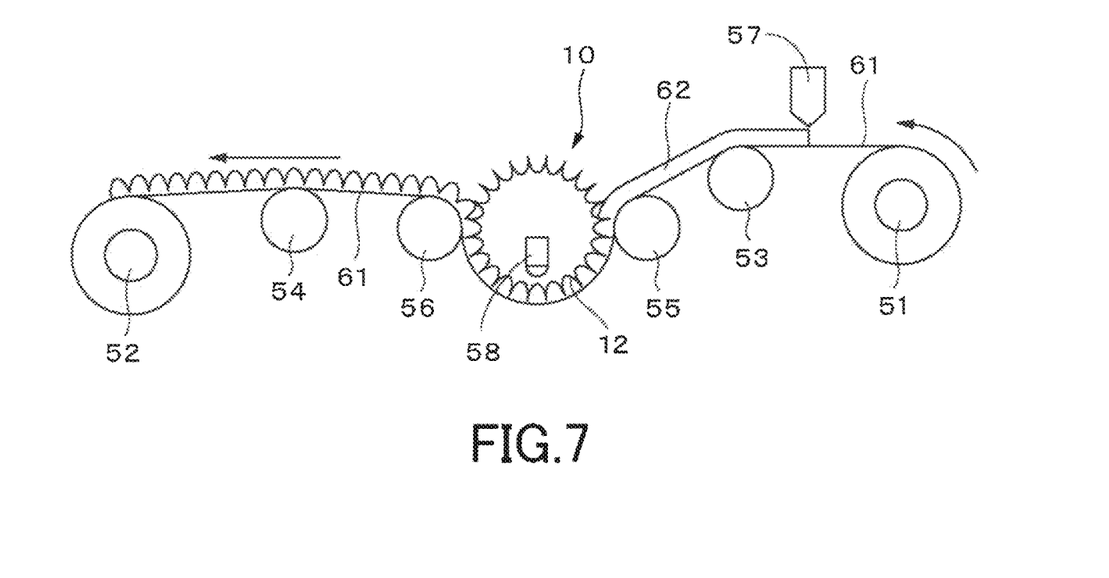
FIG. 7 is a schematic view illustrating one example of a configuration for a transfer device.

FIG. 7 is a schematic view illustrating one example of a configuration for a transfer device. The transfer device includes the cylindrical master 10, a backing supply roller 51, a take-up roller 52, guide rollers 53, 54, a nip roller 55, a peeling roller 56, an application device 57 and a light source 58.

A backing 61 in, for example, a sheet form, is wound around the backing supply roller 51 in a roll form and the backing 61 is arranged so as to enable continuous feeding therefrom via the guide roller 53. The take-up roller 52 is arranged to enable taking up of a laminated material having a resin layer 62 to which a concave/convex pattern has been transferred by this transfer device. The guide rollers 53, 54 are located in a transport route of this transfer device to transport the laminated material of the backing 61 and the resin layer 62. The nip roller 55 is arranged to enable nipping of the backing 61, which is fed from the backing supply roller 51 and has a light-curing resin composition applied thereon, and the master 10, which is in a roller form. The master 10 has a transfer surface for forming the resin layer 62. The peeling roller 56 is arranged to enable peeling of the resin layer 62, obtained by curing the light curing resin composition, from the transfer surface of the master 10.

Materials for the backing supply roller 51, the take-up roller 52, the guide rollers 53, 54, the nip roller 55, and the peeling roller 56, while being without particular limitation, can be selected as appropriate and according to desired roller characteristics from metals such as stainless steel and materials such as rubber and silicone. As the application device 57, for example, a device such as a coater having an application means can be used. As the coater, for example, with consideration to the properties of the light-curing resin composition to be applied, a coater can be selected as appropriate from such types as gravure, wire bar and die, among others.

By using such a transfer device, the structure 12 of the master 10 can be continuously replicated to a resin sheet.

Material used in the backing 61, on the condition that it be a transparent material, is without particular limitation and, for example, a material having a transparent resin composition such as polycarbonate (PC) or polyethylene terephthalate (PET) or a glass as a primary constituent may be used.

The light-curing resin composition is made, for example, from materials including monofunctional monomers, bifunctional monomers, polyfunctional monomers, and initiators, in particular, the materials listed below may be used individually or blended in a combination of two or more.

Examples of usable monofunctional monomers include, for example, carboxylic acid (acrylic acid), hydroxy compounds (2-hydroxyethyl acrylate, 2-hydroxypropyl acrylate and 4-hydroxybutyl acrylate), alkyl/alicyclic compounds (isobutyl acrylate, t-butyl acrylate, isooctyl acrylate, lauryl acrylate, stearyl acrylate, isobornyl acrylate and cyclohexyl acrylate), other functional monomers (2-methoxyethyl acrylate, methoxyethylene glycol acrylate, 2-ethoxyethyl acrylate, tetrahydrofurfuryl acrylate, benzyl acrylate, ethyl carbitol acrylate, phenoxyethyl acrylate, N, N-dimethylaminoethyl acrylate, N, N-dimethylaminopropyl acrylamide, N, N-dimethyl acrylamide, acryloyl morpholine, N-isopropyl acrylamide, N, N-diethyl acrylamide, N-vinylpyrrolidone, 2-(perfluorooctyl)ethyl acrylate, 3-perfluorohexyl 2-hydroxypropyl acrylate, 3-perfluorooctyl-2-hydroxypropyl acrylate, 2-(perfluorodecyl)ethyl acrylate and 2-(perfluoro-3-methylbutyl)ethyl acrylate), 2,4,6-tribromophenyl acrylate, 2,4,6-tribromophenyl methacrylate, 2-(2,4,6-tribromophenoxy)ethyl acrylate and 2-ethylhexyl acrylate, among others.

Examples of usable bifunctional monomers include, for example, tri(propylene glycol) diacrylate, trimethylolpropane diallyl ether and urethane acrylate, among others.

Examples of polyfunctional monomers include, for example, trimethylolpropane triacrylate, dipentaerythritol penta/hexa acrylate and di-trimethylolpropane tetraacrylate, among others.

Examples of usable initiators include, for example, 2,2-dimethoxy-1,2-diphenylethan-1-one, 1-hydroxycyclohexyl phenyl ketone and 2-hydroxy-2-methyl-1-phenylpropan-1-one, among others.

In addition, the light-curing resin composition may include, as necessary, fillers, functional additives, solvents, inorganic materials, pigments, antistatic agents, and sensitizing dyes, among others. As a filler, for example, fine inorganic particles or fine organic particles may be used. Examples of fine inorganic particles include fine metal oxide particles such as those of $SiO_2$, $TiO_2$, $ZrO_2$, $SnO_2$, and $Al_2O_3$, among others. Examples of functional additives include, for example, leveling agents, surface conditioners, absorbents, and antifoaming agents, among others.

EXAMPLES

4. Examples

Examples of the present invention will now be described. In these examples, masters were manufactured using cylindrical bases having differing internal strain and surface waviness and the reflected light intensity distribution and pattern arrangement thereof were evaluated. It should be noted that the present invention is not limited by these examples.

Cylindrical base strain measurements, cylindrical base surface wave measurements, master reflected light intensity distribution observations and master pattern arrangement observations were performed as the following manner.

Cylindrical Base Internal Strain Measurement

A strain measuring instrument (SVP vertical model manufactured by AGC Techno Glass Co., Ltd.) was used to measure internal strain in the cylindrical bases.

Cylindrical Base Surface Waviness Measurement

A surface profiler (Form Talysurf PGI 1250A manufactured by Taylor Hobson Ltd) was used to measure surface waviness on the cylindrical bases.

Master Reflected Light Intensity Distribution Measurement

The masters were rotated while a measuring head having a laser ($\lambda$=650 nm) and a light receiving element (photo diode, PD) was moved in the height direction of the master to measure intensity of reflected laser light; the measurements were logged and mapped to create a two-dimensional image of reflected light intensity distribution of the masters.

Master Pattern Arrangement Observation

A scanning electron microscope (SEM) was used to observe master surfaces.

Example 1

Figure 8:
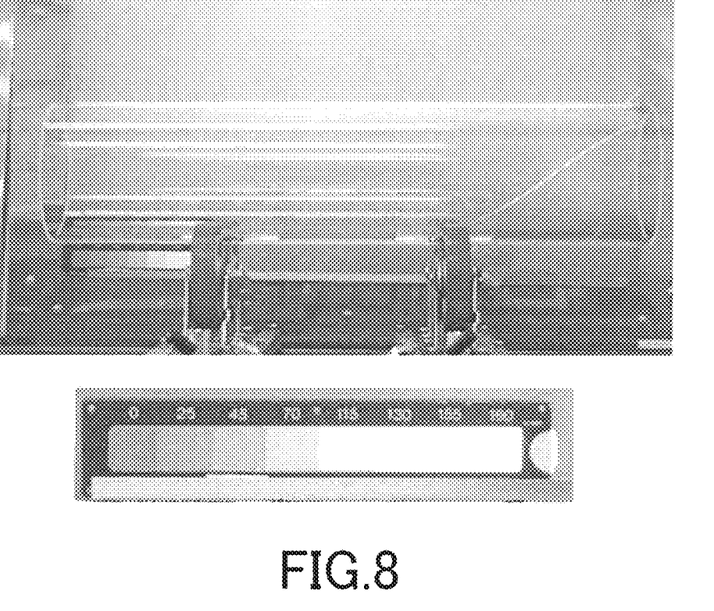
FIG. 8 is an image representing internal strain of a cylindrical base of Example 1.

A cylindrical base made of a quartz glass was prepared in which an internal strain was less than 20 nm/cm and waviness on the outer circumference surface thereof having a period of 10 mm or less had an amplitude of 100 nm or less. FIG. 8 is an image representing internal strain of the cylindrical base of Example 1. A color image corresponding to the amount of birefringence caused by internal residual stress was obtained with the strain measuring instrument and indicated an internal strain of less than 20 nm/cm.

A resist layer made from a metal oxide of tungsten was deposited on the outer surface of this cylindrical base. Subsequently, using an exposure device, a latent image of a quasi-hexagonal pattern was patterned onto the resist by using thermal lithography using a laser light. Next, the resist layer on the cylinder base was developed and exposed portions of the resist were dissolved. A resist master was thereby obtained in which the resist layer was open in a quasi-hexagonal pattern. Next, using the etching device, the resist master was etched by RIE to form concaves extending in the direction perpendicular to the surface of the glass roll. Finally, ashing was performed to completely remove the resist pattern. Thus, the target glass roll master (the master) was obtained.

Figure 9:
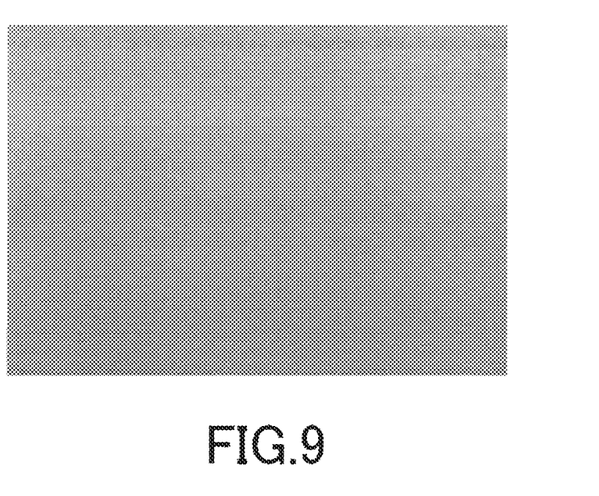
FIG. 9 is a two-dimensional image representing a reflected light intensity distribution of a master of Example 1.
Figure 10:
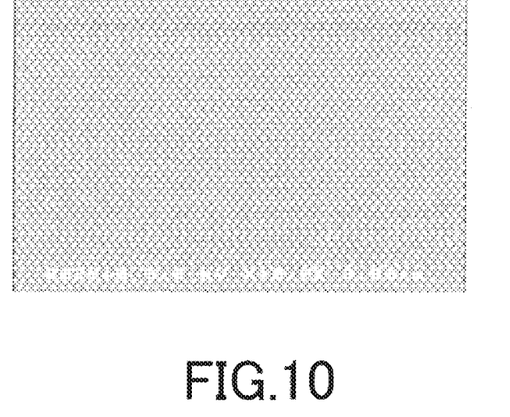
FIG. 10 is an SEM image representing a pattern arrangement of a master of Example 1.

FIGS. 9 and 10 are, respectively, a two-dimensional image representing reflected light intensity distribution of the master of Example 1 and an SEM image of a pattern arrangement of the master of Example 1. As illustrated in FIG. 9, the master of Example 1 had a uniform reflected light intensity distribution and, as illustrated in FIG. 10, disarrangement of the pattern did not occur.

Comparative Example 1

Figure 11:
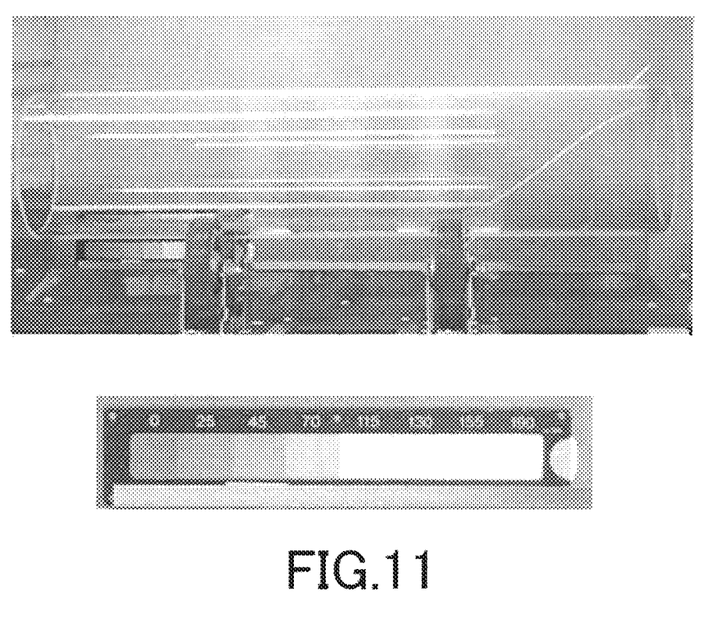
FIG. 11 is an image representing internal strain of a cylindrical base of Comparative Example 1.

A cylindrical base made of a quartz glass was prepared which included a stripe-shaped region having an internal strain of approximately 70 nm/cm and in which waviness on the outer circumference surface thereof having a period of 10 mm or less had an amplitude of 100 nm or less. FIG. 11 is an image representing internal strain of the cylindrical base of Comparative Example 1. A color image corresponding to the amount of birefringence caused by internal residual stress was obtained with the strain measuring instrument which indicated a region having an internal strain of approximately 70 nm/cm. Using this cylindrical base, a glass roll master (master) was manufactured in the same manner as in Example 1.

Figure 12:
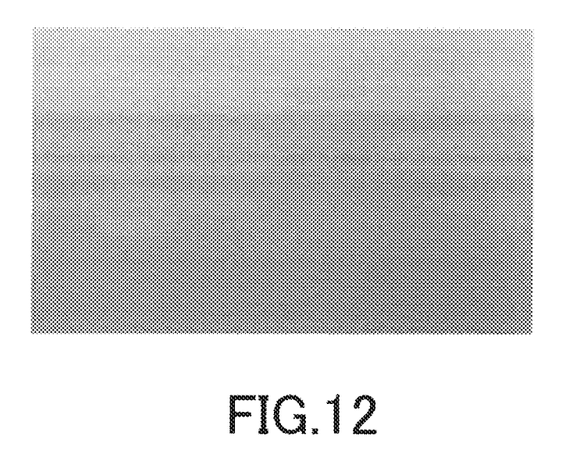
FIG. 12 is a two-dimensional image representing a reflected light intensity distribution of a master of Comparative Example 1.
Figure 13:
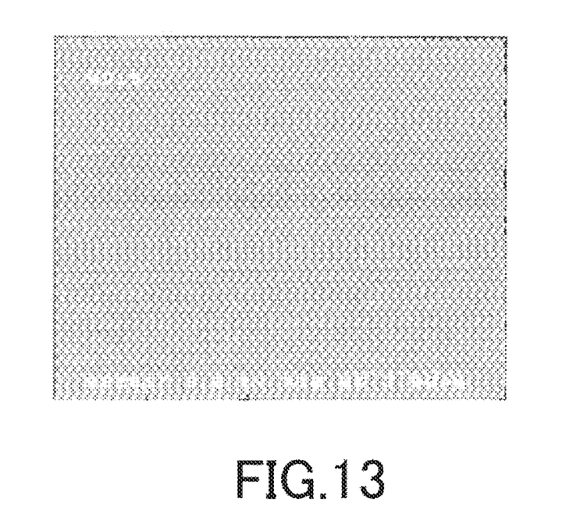
FIG. 13 is an SEM image representing a pattern arrangement of a master of Comparative Example 1.

FIGS. 12 and 13 are, respectively, a two-dimensional image representing reflected light intensity distribution of the master of Comparative Example 1 and an SEM image of a pattern arrangement of the master of Comparative Example 1. As illustrated in FIG. 12, the master of Comparative Example 1 had a stripe-shaped reflected light intensity distribution. Additionally, clouded regions were observed upon inspecting transparency. Furthermore, as illustrated in FIG. 13, disarrangement of the pattern occurred in stripe-shaped regions.

Example 2

Figure 14:
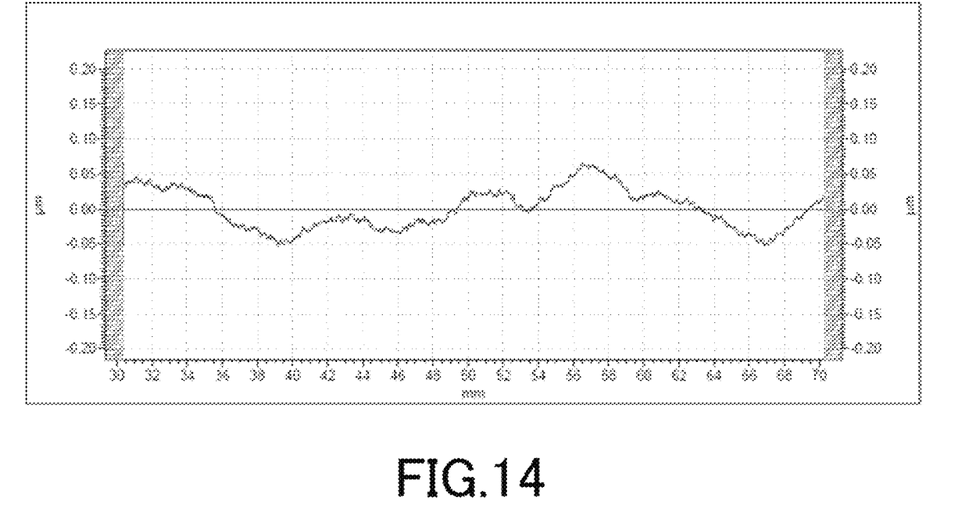
FIG. 14 is a graph representing surface waviness on a cylindrical base of Example 2.

A cylindrical base made of a quartz glass was prepared in which an internal strain was less than 20 nm/cm and waviness on the outer circumference surface thereof having a period of 10 mm or less had an amplitude of approximately 50 nm. FIG. 14 is a graph representing surface waviness on the cylindrical base of Example 2. Waviness on the outer circumference surface in the circumferential direction in Example 2 had a small amplitude of approximately 50 nm. Using this cylindrical base, a glass roll master (master) was manufactured in the same manner as in Example 1.

Figure 15:
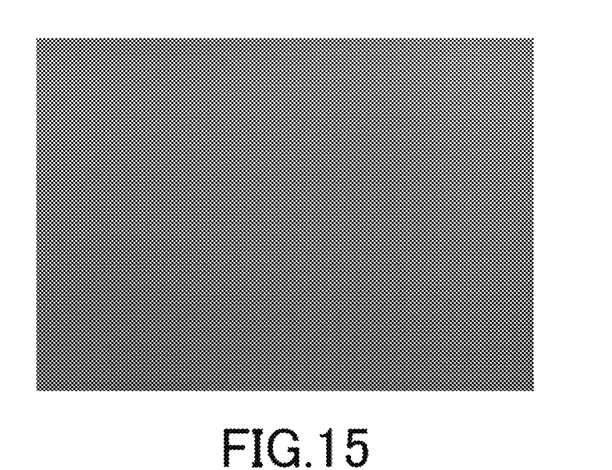
FIG. 15 is a two-dimensional image representing a reflected light intensity distribution of a master of Example 2.

FIG. 15 is a two-dimensional image representing reflected light intensity distribution of the master of Example 2. As illustrated in FIG. 15, the master of Example 2 had a uniform distribution of reflected light intensity.

Comparative Example 2

Figure 16:
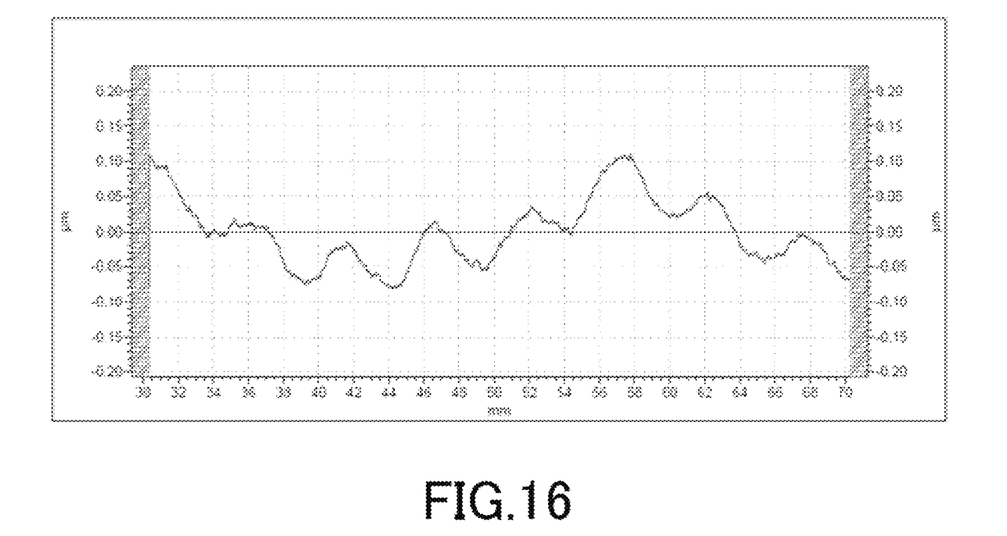
FIG. 16 is a graph representing surface waviness on a cylindrical base of Comparative Example 2.

A cylindrical base made of a quartz glass was prepared in which an internal strain was less than 20 nm/cm and waviness on the outer circumference surface thereof having a period of 10 mm or less and an amplitude of approximately 100 nm. FIG. 16 is a graph representing surface waviness on the cylindrical base of Comparative Example 2. Waviness on the outer circumference surface in the circumferential direction in Comparative Example 2 had a pitch of 5 mm and an amplitude of approximately 100 nm. Using this cylindrical base, a glass roll master (master) was manufactured in the same manner as in Example 1.

Figure 17:
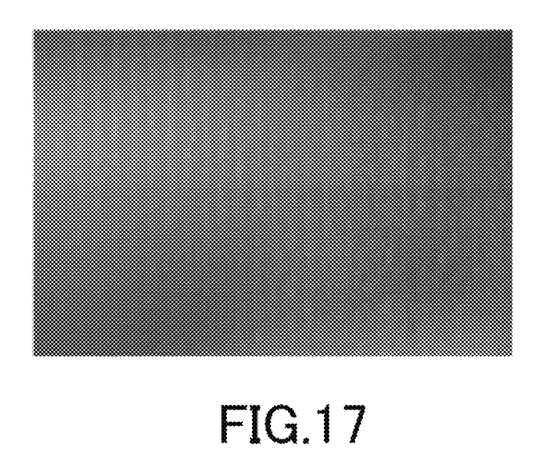
FIG. 17 is a two-dimensional image representing a reflected light intensity distribution of a master of Comparative Example 2.

FIG. 17 is a two-dimensional image representing reflected light intensity distribution of the master of Comparative Example 2. As illustrated in FIG. 17, a characteristic striped pattern occurred along waviness in the reflected light intensity distribution of the master of Comparative Example 2.

Evaluation Results

As seen in Comparative Example 1, using thermal lithography methods using thermal changes in the resist material, when exposing the desired pattern, in the case of internal strain in the cylindrical base being 70 nm/cm or more, the surface of the quartz fluctuates during exposure thereby causing disarrangement of the exposed pattern; thus, a stripe-shaped distribution of reflected light intensity was generated. In addition, clouded regions caused by scattering of transmitted light due to pattern disarrangement were observed when inspecting transparency.

Contrastingly, as seen in Example 1, in the case of internal strain in the cylindrical base being less than 70 nm/cm, disarrangement of the exposed pattern was suppressed, a uniform in-plane distribution of reflected light intensity was achieved and clouded regions caused by refracted light did not occur.

Moreover, as seen in Comparative Example 2, in the case of waviness on the outer circumference surface of the cylindrical base in the circumferential direction with a period of 10 mm or less having an amplitude of 100 nm or more, when drawing a desired pattern, tracking with the focus servo mechanism is not possible which caused fluctuations in the size of the exposed pattern which generated a characteristic striped pattern along waviness in the reflected light intensity distribution.

Contrastingly, as seen in Example 2, in the case of waviness on the outer circumference surface of the cylindrical base in the circumferential direction with a period of 10 mm or less having an amplitude of less than 100 nm, it was possible to control fluctuations in the size of the exposed pattern and achieve a uniform reflected light intensity distribution.

REFERENCE SIGNS LIST

10 master, 11 cylindrical base, 12 structure, 13 resist layer, 14 latent image, 20 laser light, 21 laser light source, 22 electro-optic modulator, 23 mirror, 24 photo diode, 25 optical modulation system, 26 condenser lens, 27 acousto-optic modulator, 28 collimator lens, 29 formatter, 30 driver, 31 mirror, 32 movable optical table, 33 beam expander, 34 objective lens, 35 spindle motor, 36 turntable, 37 control mechanism, 41 etching reaction chamber, 42 cylindrical electrode, 43 counter electrode, 44 blocking capacitor, 45 high frequency power source, 51 backing supply roller, 52 take-up roller, 53, 54 guide roller, 55 nip roller, 56 peeling roller, 57 application device, 58 light source, 61 backing, 62 resin layer

The invention claimed is:

1. A cylindrical base comprising a quartz glass in a cylindrical shape, wherein the cylindrical base has an internal strain in terms of birefringence of less than 20 nm/cm, waviness on an external circumference surface thereof having a period of 10 mm or less in the circumferential direction has an amplitude of 50 nm or less, an outer diameter of between 50 and 300 mm, a thickness of between 2 and 50 mm and a uniform distribution of reflected light intensity.

2. The cylindrical base according to claim 1, wherein the cylindrical base is used for thermal lithography in exposing a desired pattern.

3. A master comprising:
   the cylindrical base according to claim 1; and
   a structure having a plurality of concaves or convexes arranged on an outer circumference surface of the cylindrical base,
   wherein the master has a uniform distribution of reflected light intensity.

4. The master according to claim 3, wherein the structure has a plurality of tracks with a pitch that is equal to or narrower than a wavelength of light.

* * * * *